(12) United States Patent
Sakashita et al.

(10) Patent No.: US 7,520,938 B2
(45) Date of Patent: Apr. 21, 2009

(54) METHOD FOR HIGH-PRESSURE PROCESSING

(75) Inventors: Yoshihiko Sakashita, Takasago (JP);
Takahiko Ishii, Takasago (JP);
Masahiro Yamagata, Takasago (JP);
Tetsuya Yoshikawa, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 593 days.

(21) Appl. No.: 10/915,320

(22) Filed: Aug. 11, 2004

(65) Prior Publication Data

US 2005/0051194 A1 Mar. 10, 2005

(30) Foreign Application Priority Data

Aug. 13, 2003 (JP) .............................. 2003-292924

(51) Int. Cl.
*B08B 5/00* (2006.01)
(52) U.S. Cl. ...................................................... 134/21
(58) Field of Classification Search ................... 134/21
See application file for complete search history.

(56) References Cited

U.S. PATENT DOCUMENTS 6,500,605 B1 * 12/2002 Mullee et al. ............... 430/329
6,554,507 B2 * 4/2003 Namatsu ..................... 396/611
2004/0112402 A1 * 6/2004 Simons et al. .................. 134/1

FOREIGN PATENT DOCUMENTS

| JP | 03-057217 | 3/1991 |
|---|---|---|
| JP | 2000-308862 | 11/2000 |
| JP | 2001-319917 | 11/2001 |
| JP | 2002-324778 | 11/2002 |
| JP | 2002-367943 | 12/2002 |

OTHER PUBLICATIONS

The machine english translation of Japense Patent publication 2002-367943.*

* cited by examiner

*Primary Examiner*—Frankie L Stinson
*Assistant Examiner*—Samuel A Waldbaum
(74) *Attorney, Agent, or Firm*—Oblon, Spivak, McClelland, Maier & Neustadt, P.C.

(57) ABSTRACT

An object is subjected to high-pressure processing by bringing at least a high-pressure fluid into contact with the object under pressure in a high-pressure processing chamber, and then the high-pressure processing chamber is depressurized while the temperature in the chamber is controlled to be maintained above a temperature achieved by an adiabatic expansion, the adiabatic expansion starting from the pressure and temperature at the end of the high-pressure processing step. To control in such a way, the temperature in the high-pressure processing chamber is controlled so as to suppress or recover a temperature descent caused by an adiabatic expansion during the depressurizing step. This solves a problem in which the temperature is decreased to the vapor-liquid phase coexistence region or a region in which a solid is deposited.

9 Claims, 3 Drawing Sheets

METHOD FOR HIGH-PRESSURE PROCESSING

BACKGROUND OF THE INVENTION

1. Field of the Invention

The present invention relates to a method for high-pressure processing which is employed for cleaning an object having projections and depressions on a surface of the object (a microstructured surface), for example, a semiconductor substrate. In particular, the present invention relates to a method for high-pressure processing to optimize a depressurizing step after a high-pressure processing step.

2. Description of the Related Art

In a process for manufacturing a semiconductor, patterning with a resist requires a high-pressure processing including: a cleaning step of removing undesired materials such as an unnecessary resist remaining on a substrate after patterning and contaminants such as a polymeric substance formed during etching and remaining on the substrate; and a step of drying surfaces of the substrate to remove moisture on the surfaces of the substrate.

Since a process for manufacturing a semiconductor is usually performed in a clean room, a high-pressure processing is preferably performed in the clean room. However, since building and maintaining a clean room require considerable expenses, small occupying space and excellent functionality have been required for a high-pressure processing apparatus. The demands are further increasing with finer design rules of a semiconductor.

In recent years, on a process for manufacturing a semiconductor, a method for high-pressure processing with a supercritical fluid has been conducted.

For example, in a cleaning substep of a high-pressure processing step, to enhance the efficiency of cleaning, it is necessary to quickly pressurize a high-pressure processing chamber after an object is placed into the chamber and to quickly depressurize when removing the object from the chamber.

To address these needs, the inventors have already proposed an apparatus for high-pressure processing and a method for high-pressure processing, which can quickly pressurize and depressurize a high-pressure processing chamber, in Japanese Unexamined Patent Application Publication No. 2002-367943.

In high-pressure processing, there are problems in which the temperature in a chamber is decreased to the vapor-liquid phase coexistence region or a region in which a solid is deposited according to an adiabatic expansion during depressurization; hence, particles are produced due to the appearance of the liquid phase, thus reducing yield of the semiconductor wafer. To solve these problems, a slow rate of depressurization is effective. However, a problem arises in that time required for performing high-pressure processing becomes longer.

In the above-described art already proposed by the inventors, the temperature of a high-pressure fluid is increased before a depressurizing step. Therefore, the depressurizing step can be performed passing through a vapor phase. Consequently, the problem with particles due to the appearance of the liquid phase has been overcome. However, in this art, a cost and time required to increase temperature have been impediments to the improvement of productivity. When heating an object to a temperature above a processing temperature is undesirable, the improvement of the art has been required.

SUMMARY OF THE INVENTION

Accordingly, it is an object of the present invention to solve the above-described problems caused by a temperature descent due to an adiabatic expansion during depressurization, particularly, to provide a technique for solving problems with a temperature descent to the vapor-liquid phase coexistence region or a region in which a solid is deposited.

It is another object of the present invention to provide a technique for quickly and effectively achieving high-pressure processing steps.

A method for high-pressure processing to solve the above-described problems includes the following steps: a high-pressure processing step of processing an object under a high pressure by bringing at least a high-pressure fluid into contact with the object in a high-pressure processing chamber under the high pressure; and a depressurizing step of decreasing the pressure in the high-pressure processing chamber to atmospheric pressure while the temperature in the chamber is controlled to be maintained above a temperature achieved by an adiabatic expansion, the adiabatic expansion starting from the pressure and temperature at the end of the high-pressure processing step, wherein the temperature in the chamber during the depressurizing step does not exceed the temperature at the end of the high-pressure processing step.

In a method for high-pressure processing of the present invention, the profiles of pressure and the temperature in the chamber are preferably controlled so that the temperature does not reach the vapor-liquid phase coexistence region during the depressurizing step.

In a method for high-pressure processing of the present invention, the temperature in the high-pressure processing chamber can be controlled so as to suppress or recover a temperature descent caused by an adiabatic expansion during the depressurizing step. The method for high-pressure processing further includes a feeding substep of introducing a heated and pressurized fluid into the chamber during the depressurizing step. Consequently, the temperature in the chamber can be controlled so as to suppress or recover a temperature descent caused by an adiabatic expansion during the depressurizing step.

In a method for high-pressure processing of the present invention, the heated and pressurized fluid can be fed into the chamber after the pressure is reduced to a pressure which does not lead to a vapor-liquid phase coexistence region during the depressurizing step.

In a method for high-pressure processing of the present invention, the feeding rate of the heated and pressurized fluid into the high-pressure processing chamber and the draining rate of the heated and pressurized fluid from the high-pressure processing chamber are controlled such that a pressure in the high-pressure processing chamber is reduced or maintained substantially constant during the feeding substep.

In a method for high-pressure processing of the present invention, since the pressure in the high-pressure processing chamber can be reduced to atmospheric pressure without the appearance of the liquid phase and a passage through the vapor-liquid phase coexistence region, which are problems caused during a depressurizing step, a problem with particles due to the appearance of the liquid phase is suppressed. Hence, a product yield is improved. Furthermore, in a method for high-pressure processing of the present invention, since the temperature in the high-pressure processing chamber is not increased more than necessary, the depressurizing step is quickly and effectively achieved. In addition, an object is not exposed to high temperature more then necessary.

DESCRIPTION OF THE PREFERRED EMBODIMENTS

Figure 1:
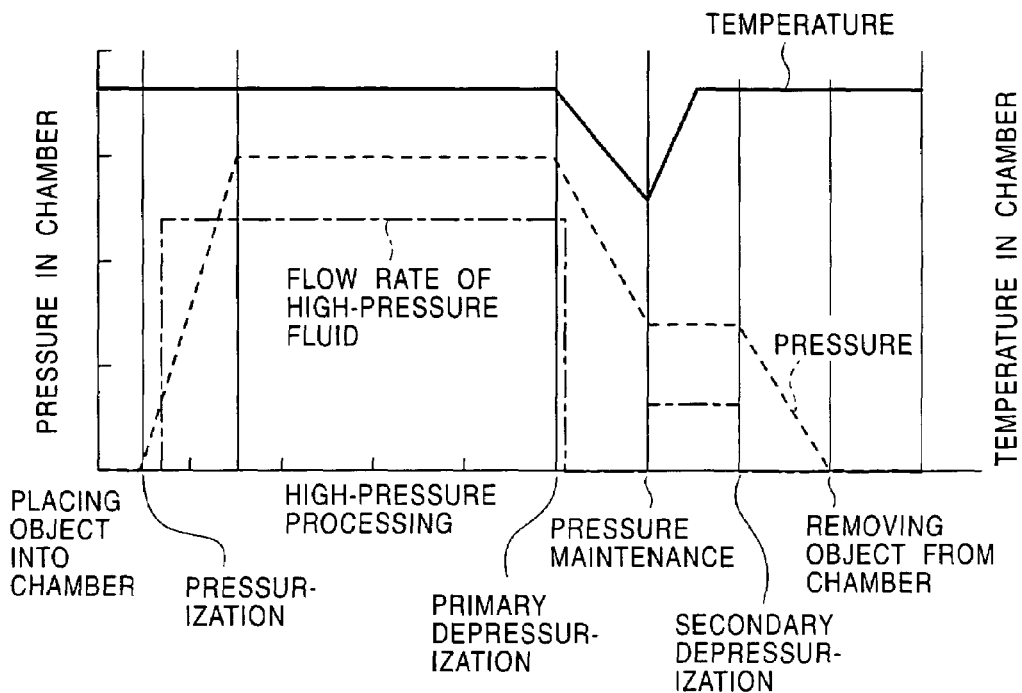
FIG. 1 is a graph depicting variations in temperature and pressure according to an embodiment of the present invention.

An example of high-pressure processing in a method for high-pressure processing according to the present invention includes cleaning treatment in which contaminants adhering to an object, for example, a semiconductor substrate having a residual resist, are peeled off and removed from the object.

However, the object is not limited to a semiconductor substrate and includes an object in which a discontinuous or continuous layer made of dissimilar material is formed or remains on various bases such as metals, plastics, and ceramics. In addition, a high-pressure processing of the present invention is not limited to cleaning treatment and includes a treatment for removing an undesired material from the surface of an object with at least high-pressure fluid, preferably with the high-pressure fluid and a chemical agent, the treatment including, for example, a drying treatment for removing moisture adhering to a substrate, a heat treatment for removing an undesired material on a substrate, and development.

A high-pressure fluid used in a method for high-pressure processing according to the present invention is preferably carbon dioxide in view of safety, cost, and ease of reaching its supercritical state. Furthermore, water, ammonia, nitrous oxide, and ethanol can also be used. The reasons for using high-pressure fluids are that the high-pressure fluids have high diffusivity and can readily disperse dissolved contaminants into the high-pressure fluids itself. Supercritical fluids have properties intermediate between liquids and vapors and can readily penetrate into a microstructured region. In addition, since the supercritical fluids have high density, it can contain additives (chemical agent) significantly greater than gases.

A high-pressure fluid used in the present invention preferably has a pressure of 1 MPa or more, high density, high solvency, low viscosity, and high diffusivity. More preferably, a supercritical fluid or a subcritical fluid is used. For example, carbon dioxide reaches its supercritical state above a temperature of 31° C. and a pressure of 7.4 MPa. When a cleaning substep, a rinsing substep after the cleaning substep, a displacement substep, a drying step (heating), and a development step are performed, a subcritical or a supercritical fluid having a pressure of 5 to 30 MPa is preferably used, more preferably, 7.4 to 20 MPa.

Cleaning treatment as an example of application of a method for high-pressure processing according to the present invention will now be described, but the high-pressure processing is not limited to only cleaning treatment as described above.

There is a possibility that polymer contaminants such as a resist and a polymeric substance formed during etching on a semiconductor substrate are removed by a method for high-pressure processing. In view of an unsatisfactory cleaning power of a high-pressure fluid alone, for example, carbon dioxide in its high-pressure state, cleaning treatment is preferably performed with an additive. The additive of a basic compound functioning as a cleaning component is preferably used. A basic compound has the effect of hydrolyzing a polymer, which is heavily used for a resist, and has thus an excellent cleaning effect. Examples of the basic compounds functioning as cleaning components include quaternary ammonium hydroxide, quaternary ammonium fluoride such as ammonium fluoride, alkylamines, alkanolamines such as monoethanolamine, and hydroxylamine. A high-pressure fluid preferably contains 0.01 percent to 8 percent by mass of the cleaning component.

The above-described cleaning components are usually difficult to dissolve in high-pressure fluids; hence, a compatibilizer, which can function as an aid for dissolving or uniformly dispersing these cleaning components into carbon dioxide, is preferably used as a secondary additive.

When a rinsing substep as described below is performed after a cleaning substep, the compatibilizer accelerates the dissolution of undesired materials into a high-pressure fluid during the rinsing substep and prevents undesired materials (contaminants) from redepositing on an object.

Compatibilizers are not limited, provided that the compatibilizers can dissolve cleaning components and undesired materials in high-pressure fluids. Examples of the compatibilizers preferably include alcohols such as methanol, ethanol, and isopropyl alcohol; and alkyl sulfoxides such as dimethyl sulfoxide. An amount of compatibilizer can be selected in the range of 0.01 percent to 50 percent by mass in each substep of cleaning and rinsing.

Figure 2:
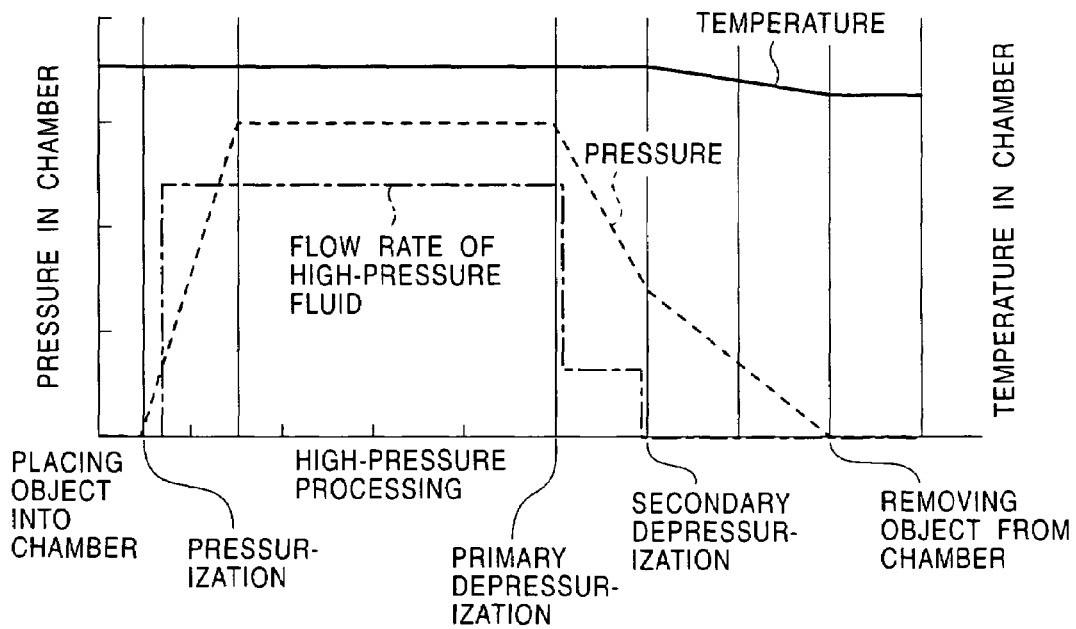
FIG. 2 is a graph depicting variations in temperature and pressure according to another embodiment of the present invention.

A method for high-pressure processing of the present invention will now be described with reference to the drawings. FIGS. 1 and 2 are graphs illustrating the variations in temperatures and pressures in a chamber of high-pressure processing apparatus according to embodiments of the present invention. The step of "high-pressure processing" described in the graphs includes the substeps with high-pressure fluids, for example, a cleaning substep, a rinsing substep, and a displacement substep.

In a method of the present invention, a pressure in a high-pressure processing chamber when placing an object into the chamber is the same as atmospheric pressure because the chamber is opened. After the object is placed in the chamber, the chamber is enclosed and then pressurized to a predetermined pressure by introducing a high-pressure fluid having a predetermined temperature and pressure into the chamber (pressurizing step). The temperature in the chamber is also increased to a predetermined temperature. In the pressurizing step, the chamber may be stepwise pressurized to a predetermined pressure.

In a high-pressure processing step, a high-pressure processing is performed under a predetermined pressure and temperature described above. In a cleaning substep, a mixture fluid containing a cleaning component, a compatibilizer, and a high-pressure fluid, is used to peel off a resist and a polymeric substance from a substrate. When carbon dioxide is used as the high-pressure fluid, carbon dioxide preferably has a pressure of 5 to 30 MPa, more preferably 7.4 to 20 MPa, and a temperature of 25° C. to 80° C. The high-pressure processing step employs a batch operation, in which a fluid is not fed into and drained from the chamber during the high-pressure processing step, and a flow operation, in which a fluid is fed into and drained from the chamber during the high-pressure processing step. In the high-pressure processing steps shown in FIGS. 1 and 2, such flow treatments are employed; hence, the flow rates (feeding rates) of the high-pressure fluids into the chamber exhibit constant values. The high-pressure fluids are drained from the chamber at the same flow rates as the feeding rates simultaneously with the feeding.

Subsequently, a rinsing substep is performed. The rinsing substep is optional but useful to remove undesired materials, which are peeled from an object, and a chemical (cleaning component) from the high-pressure processing chamber, the undesired materials and the chemical being used during a high-pressure processing step. When the undesired materials and the chemical agent are hardly dissolved in a high-pressure fluid, after the cleaning substep, the feeding of the high-pressure fluid alone into the chamber decreases the effect of the compatibilizer, thus leading to the possibility of deposition of the chemical agent and undesired materials. Therefore, the rinsing substep is preferably performed with a rinsing mixture containing a high-pressure fluid and a compatibilizer, i.e., the rinsing mixture having a different composition from a processing fluid used in a high-pressure processing step, the processing fluid containing a high-pressure fluid, a cleaning component, and a compatibilizer. The chemical agent and the undesired materials are dissolved in the high-pressure fluid by the rinsing mixture containing a compatibilizer and then removed with the high-pressure fluid from the chamber. In this way, the chemical agent and the undesired materials are surely removed. In particular, when an object has a complicated shape, contaminants adhering to a back surface of the object relative to the direction of flow of the high-pressure fluid are not readily removed. However, the use of a compatibilizer in the rinsing substep effectively drains such contaminants. Therefore, the rinsing substep is preferably performed.

The rinsing substep is performed by feeding a rinsing mixture containing a high-pressure fluid and a compatibilizer into the chamber while draining a mixture fluid containing contaminants from the chamber after the cleaning substep. The rinsing substep is preferably performed at the same pressure and temperature as those in the cleaning substep. Hence, the feeding and the draining are preferably equal.

A displacement substep is performed after the rinsing substep or the cleaning substep when the rinsing substep is not performed. The displacement substep is optional but useful to completely remove the chemical agent and the undesired materials in the chamber before a depressurizing step. If the chemical agent and the undesired materials remain in the depressurizing step, these contaminants are deposited by depressurization. As a result, the deposited contaminants possibly adhere onto the surface of the object. When the rinsing substep is not performed, a cleaning component, a compatibilizer, and an undesired material possibly remain in the chamber depending on a cleaning substep before the depressurizing step, while when the rinsing substep is performed, the cleaning component and the undesired materials peeled from an object are already removed before the depressurizing step. However, the compatibilizer (second chemical) used in the rinsing substep possibly remains in the chamber. In such a case, a high-pressure fluid not containing any other material such as the undesired materials and/or a chemical agent is fed into the chamber, and then the cleaning mixture used in the cleaning substep (when the rinsing substep is not performed) or a rinsing mixture used in the rinsing substep is drained from the chamber. In this way, the chamber can be displaced by a high-pressure fluid alone. This displacement substep may be performed at a comparable pressure and temperature with the cleaning substep.

Subsequently, a depressurizing step is performed. If this depressurizing step is performed by only draining a high-pressure fluid in the chamber without a heat transfer between the inside and the outside of the chamber, the temperature in the chamber is decreased due to adiabatic expansion during depressurization. In particular, when the temperature in the chamber is decreased to the vapor-liquid phase coexistence region or a region in which a solid is deposited, particles are produced because of the appearance of the liquid phase. As a result, the yield is reduced. Furthermore, decreasing the temperature in the chamber quickly causes the undesired solidification of the high-pressure fluid, for example, the generation of dry ice. The depressurizing step can be performed without passing through the vapor-liquid phase coexistence region by slowly depressurizing the chamber over a prolonged period of time. However, the processing time is longer, and the throughput is reduced.

Accordingly, in the present invention, the above-described problems are solved by depressurizing the chamber while the temperature in the chamber is controlled to be maintained above a temperature achieved by an adiabatic expansion, the adiabatic expansion at the end of the high-pressure processing step. For example, the temperature in the chamber is preferably controlled so as to suppress or recover a temperature descent caused by an adiabatic expansion during the depressurizing step. The suppression or the recovery of the temperature descent may be controlled by adjusting heat dissipated and heat supplied, and the temperature of heat supplied. The temperature need not be maintained above a temperature achieved by an adiabatic expansion during the overall depressurizing step, i.e., from starting depressurization to atmospheric pressure. For example, the depressurizing step may partially include a substep in which the temperature in the chamber decreases according to an adiabatic expansion. The temperature in the chamber during the depressurizing step does not exceed the temperature at the end of the high-pressure processing step.

Recovering the temperature descent means that the temperature decreased by an adiabatic expansion is increased. The temperature is preferably increased to a temperature before depressurization. For example, an adiabatic expansion caused by simply draining a fluid from the chamber decreases a pressure and a temperature to substantially theoretical values. And then, the rate of depressurization is reduced, or the depressurization is temporarily stopped. In this way, the temperature descent is recovered. That is, recovering the decrease in temperature is accomplished by controlling such that the rate of temperature descent induced by the depressurization is slower than that of temperature increase caused by, for example, a heat transfer from the chamber and the feeding of a heated and pressurized fluid. The temporary stop of the depressurization is achieved by stopping the draining of the fluid from the chamber or by controlling such that the feeding of the heated and pressurized fluid into the chamber is equal to the draining of the fluid from the chamber. The temperature descent caused by depressurization is stopped by suspending the draining of the fluid from the chamber. As a result, the temperature in the chamber can be recovered by the heat transfer from the chamber. The reason why the temperature can be recovered by the heat transfer from the chamber is that although the temperature in the chamber is decreased by depressurization, the temperature of the chamber itself is hardly decreased by the depressurization because of the high heat-capacity of the chamber; hence, the chamber has a temperature higher than that of the vapor in the chamber.

For example, by suspending the depressurization by temporarily stopping the draining of a fluid from the chamber or by feeding a heated and pressurized fluid having a temperature higher than the temperature in the chamber reached by depressurization, the temperature in the chamber can be effectively increased. By feeding a heated and pressurized fluid having a temperature higher than that of a high-pressure fluid used in high-pressure processing step, the temperature in the chamber is preferably increased to the temperature in the chamber before depressurization. To recover the temperature in the chamber by feeding a heated and pressurized fluid while depressurizing, the temperature of the heated and pressurized fluid is preferably determined in consideration of the temperature descent induced by depressurization. In particular, in order to recover from the temperature descent to a temperature before depressurization while the depressurizing step is performed, it is necessary that the temperature of the heated and pressurized fluid is higher than the temperature in the chamber before depressurization. In addition, heat is transferred from the chamber itself to inside of the chamber as described above. Hence, the temperature in the chamber can be recovered to a certain degree, even when the temperature of the heated and pressurized fluid is lower than a temperature reached by depressurization.

The suppression of temperature descent means that the actual rate of temperature descent is slower than the theoretical rate of temperature descent caused by an adiabatic expansion. The suppression also includes when the temperature is not decreased (balanced). When the rate of temperature increase described above is higher than the rate of temperature descent caused by an adiabatic expansion, the temperature descent is suppressed. Since heat transfer occurs from the chamber during normal (not adiabatic) depressurization, the theoretical rate of temperature descent described above is determined in consideration of the temperature descent caused by an adiabatic expansion and the temperature increase caused by heat transfer from the chamber. Hence, the suppression of temperature descent is achieved by actively supplying heat, for example, heating the chamber and feeding a heated and pressurized fluid into the chamber. The suppression of temperature descent can depressurize the chamber while preventing the temperature in the chamber from reaching to the vapor-liquid phase coexistence region. Therefore, the temperature descent is preferably suppressed such that the vapor-liquid phase coexistence region does not appear. The suppression of temperature descent can be accomplished by, for example, the following processes: Increasing heat transfer from the chamber by heating the chamber with a heater provided with the chamber; feeding a heated and pressurized fluid having a quantity of heat that cannot increase the temperature in the chamber; or adjusting the feeding rate of a heated and pressurized fluid into the chamber and the draining rate of a fluid from the chamber. Such temperature-controlling processes are not limited to the above-described processes, and various processes can be employed. When the temperature descent is suppressed as described above, the chamber can be depressurized while the temperature in the chamber is inevitably controlled to be maintained above a temperature achieved by an adiabatic expansion, the adiabatic expansion starting from the pressure and temperature at the end of the high-pressure processing step.

In the present invention, the suppression or the recovery of temperature descent is preferably controlled by feeding a heated and pressurized fluid. When the heated and pressurized fluid continues to be fed into the chamber, it takes a long time to reduce the pressure in the chamber to near atmospheric pressure in order to remove an object from the chamber. When a feeding substep of feeding a heated and pressurized fluid is provided, the heated and pressurized fluid is preferably fed at least before the appearance of the vapor-liquid phase coexistence region by depressurization. The heated and pressurized fluid may be fed from the start of the depressurizing step. In the feeding substep, the feeding of the heated and pressurized fluid is stopped when the temperature in the chamber reaches a desired temperature, preferably after the temperature descent is recovered to a temperature before depressurization or after the pressure reaches a desired pressure without passing through the vapor-liquid phase coexistence region but with passing through the vapor phase.

In the present invention, the temperature descent is preferably suppressed or recovered by feeding a heated and pressurized fluid. The excessive flow rate of the heated and pressurized fluid increases the pressure in the chamber, thus reducing the efficiency of depressurization. Therefore, when the heated and pressurized fluid is fed, to prevent such a pressure increase, the pressure in the chamber is preferably controlled by draining the fluid from the chamber. The draining rate of the fluid from the chamber is not limited. The feeding and the draining may be adjusted such that the inside of the chamber is maintained under a constant pressure (FIG. 1). The pressure in the chamber may be reduced by increasing the draining rate compared with the feeding rate (FIG. 2). When the depressurizing step is performed while feeding the heated and pressurized fluid, in view of enhancing the depressurization efficiency, it is preferable to achieve a higher effect of recovering temperature by a lower feeding rate. That is, it is preferable to-reduce the feeding rate of the heated and pressurized fluid and to heat the chamber so as to maintain or recover the temperature in the chamber.

As shown in FIG. 1, when the temperature in the chamber is decreased during a primary depressurizing substep, a pressure-maintaining substep is preferably provided such that the pressure in the chamber is maintained substantially constant. In the pressure-maintaining substep, a heated and pressurized fluid is fed to recover the temperature in the chamber to a predetermined temperature. And then, the pressure in the chamber is decreased again. In this way, problems of a vapor-liquid phase coexistence region and a temperature descent can be solved.

As shown in FIG. 2, from the beginning of the depressurizing step, to prevent the temperature descent induced by depressurization and to depressurize while maintaining the temperature before starting the depressurizing step, the depressurization is performed while feeding a heated and pressurized fluid having a temperature higher than the temperature before starting the depressurization. In this case, the temperature of the heated and pressurized fluid fed is preferably controlled in consideration of the temperature descent. When the temperature descent occurs without passing through the vapor-liquid phase coexistence region, a heated and pressurized fluid, which has the same temperature as that in the high-pressure processing, may be used.

In the depressurizing step, a stepwise depressurizing step can be employed. The stepwise depressurization means that there are different rates of depressurization at different points. In FIGS. 1 and 2, two-stage depressurization (a primary depressurizing substep and a secondary depressurizing substep) is employed. The depressurizing step may be performed at a constant rate of depressurization.

Figure 3:
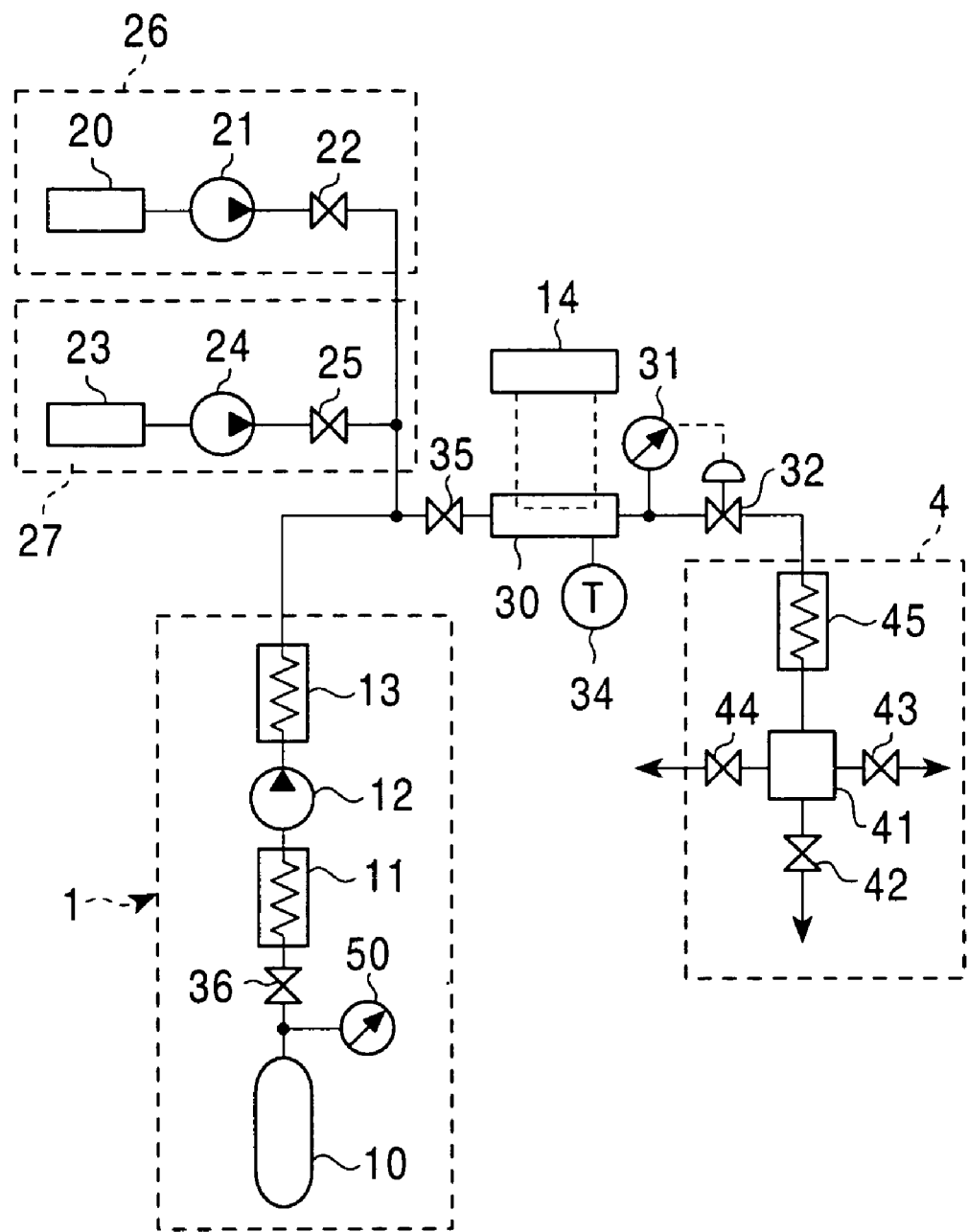
FIG. 3 is a schematic view illustrating an embodiment of a method according to the present invention.

The pressure (a gage pressure) in the chamber is measured with a pressure detector (for example, a pressure gage 31 as shown in FIG. 3). The temperature in the chamber is measured with a temperature measuring instrument (for example, a temperature-measuring instrument 34 as shown in FIG. 3).

As shown in FIG. 1, the primary depressurizing substep is performed such that the pressure at the end of the primary depressurizing substep is not within the vapor-liquid phase coexistence region. Subsequently, in the pressure-maintaining substep, the pressure in the chamber is maintained substantially constant by controlling the feeding rate and the draining rate of a heated and pressurized fluid as described above. In the pressure-maintaining substep, the heated and pressurized fluid having a temperature higher than that before starting depressurization is fed into the chamber while controlling the draining rate of the fluid from the chamber such that the pressure is maintained constant. Consequently, the temperature descent during the primary depressurizing substep is recovered to a temperature before depressurization. After recovering the temperature, the feeding of the heated and pressurized fluid is stopped, and then the secondary depressurizing substep is performed to atmospheric pressure. The secondary depressurizing substep is performed without the feeding of the heated and pressurized fluid. Hence, the temperature is decreased with decreasing the pressure to atmospheric pressure during the secondary depressurizing substep. However, since the pressure at starting the secondary depressurizing substep is already lower than that before starting the primary depressurizing substep, the temperature at the end of the secondary depressurizing substep is high compared with that of a general method in which a temperature control like the present invention is not performed. Therefore, a method of the present invention has the advantage over a general method in view of cost and time required to increase temperature.

As shown in FIG. 2, in the primary depressurizing substep, depressurization is performed while a heated and pressurized fluid is fed into the chamber. The chamber is maintained at a temperature before the depressurization. After decreasing the pressure to a predetermined value, the feeding of the heated and pressurized fluid is stopped. Subsequently, the secondary depressurizing substep is performed.

The preferred embodiments of the present invention will now be described with reference to a high-pressure processing apparatus shown in FIG. 3. A high-pressure fluid feeder 1 includes a medium reservoir 10 for high-pressure fluid (hereinafter, referred to as "reservoir 10"), a booster 12, a pressure gage 50, and a control valve 36 for adjusting the feeding rate of a high-pressure fluid depending on a pressure measured by the pressure gage 50, which are essential. The high-pressure fluid feeder 1 further includes a supercooler 11, and heater 13, which are optional. Examples of the reservoir 10 include a cylinder used for a high-pressure fluid and a cold converter.

When carbon dioxide is used as a high-pressure fluid, liquefied carbon dioxide is usually stored in the reservoir 10. The supercooler 11 cools a fluid in advance to block gasification in the booster 12. The booster 12 pressurizes the fluid to give a high-pressure carbon dioxide. An example of the booster 12 includes a pressurizing pump.

The heater 13 is disposed in order to heat carbon dioxide to a predetermined temperature at which high-pressure processing is performed. Another heater 14 (not shown) may be disposed at or near a high-pressure processing chamber 30 (hereinafter, referred to as "chamber 30"). The chamber 30 may be heated with the heater 14 while the carbon dioxide is heated with the heater 13 up to a predetermined temperature. Or the carbon dioxide may be unheated. The temperatures of the high-pressure chamber 30 itself and of carbon dioxide may be adjusted such that the temperature in the chamber 30 are optimized for each step performed in the chamber 30.

The apparatus having one chamber 30 is showed, but a plurality of chambers may be provided. Sharing the high-pressure fluid feeder 1 with the plurality of chambers increases the operation rate of the booster 12 and decreases the occupying space of the entire apparatus. The chamber 30 is not limited, provided that the chamber 30 can maintain high-pressure and has a lid that can be opened and closed. A control valve 32 that can adjust the valve opening is disposed downstream from the chamber 30. A control valve 35 that is a simple on-off valve is disposed upstream from the chamber 30. Both control valves control the pressure and the flow rate of a fluid. The pressure in the chamber 30 is controlled depending on a pressure measured with a pressure gage 31 disposed at the chamber 30. The temperature in the chamber 30 is measured with the temperature-measuring instrument 34 disposed at the chamber 30.

A first-chemical supplier (cleaning component supplier) 26 includes a first-chemical reservoir 20, a force pump 21, and a first-chemical supplying controller 22. A second-chemical supplier (compatibilizer supplier) 27 similarly includes a second-chemical reservoir 23, a force pump 24, and a second-chemical supplying controller 25. The first and the second-chemical suppliers 26 and 27 pressurize the cleaning component and the compatibilizer with the force pumps 21 and 24, respectively, to a predetermined pressure, and then supply the pressurized cleaning component and compatibilizer to the chamber 30. When a rinsing substep or a displacement substep is performed, the fluids supplied to the chamber 30 in respective substeps preferably have different compositions. Hence, the force pumps 21 and 24 can be preferably changed in flow rate of each fluid. The first and the second-chemical supplying controllers 22 and 25 are not limited, provided that the first and second controllers 22 and 25 have an open/close mechanism. For example, high-pressure valves are used as the first- and the second-chemical supplying controllers 22 and 25. The composition of a processing fluid in the chamber 30 can be changed by operating the first and the second-chemical supplying controllers 22 and 25 and by adjusting the control valve 36. The following compositions can be produced: A mixture of the high-pressure fluid, the first chemical, and the second chemical; a mixture of the high-pressure fluid and the second chemical; and the high-pressure fluid alone. A pipe mixer such as a static mixer may be disposed between the chamber 30 and the first and the second-chemical supplying controllers 22 and 25, the pipe mixer mixing the high-pressure fluid and chemical agent(s) by regulating the flows of a high-pressure fluid and chemical agent(s).

In the implementation of a method of the present invention, firstly, an object is placed into the chamber 30 with a transfer unit (not shown). A handling machine such as a robot and a transport mechanism are available to the transfer unit.

Next, a fluid stored in the reservoir 10 is cooled with the supercooler 11, thus resulting in a complete liquid state, if necessary. And then, the fluid is pressurized with a pressurizing pump functioning as the booster 12 and heated with the heater 13, thus leading to a supercritical fluid. The resulting supercritical fluid is delivered to the chamber 30. A subcritical state or a high-pressure liquid state may be available.

In a pressurizing step, the high-pressure fluid is fed into the chamber 30 to pressurize the chamber 30 to a predetermined pressure. Stepwise pressurization may be performed in the pressurizing step. The first- and the second-chemical supplying controllers 22 and 25 are opened (supply mode). The first chemical in the first-chemical reservoir 20 is delivered to the chamber 30 with the force pump 21, and the second chemical in the second-chemical reservoir 23 is delivered to the chamber 30 with the force pump 24, to adjust the pressure in the chamber 30 to a predetermined pressure.

After supplying the high-pressure fluid and chemical agents to the chamber 30, the control valve 35 and the first- and the second-chemical supplying controllers 22 and 25 are closed (stop mode). And then a high-pressure processing step (a cleaning substep) is started. The control valve 32 disposed downstream from the chamber 30 is closed during the cleaning substep. The cleaning time of about 30 to 60 seconds is usually sufficient.

For example, undesired materials (contaminants) adhering to the object are dissolved in a mixture fluid containing the high-pressure fluid, a cleaning component, and a compatibilizer that is optionally added, during the cleaning substep. Hence, it is necessary to drain the resulting mixture fluid containing the contaminants from the chamber 30. Since the contaminants are dissolved in the high-pressure fluid by the functions of the cleaning component and the compatibilizer, the contaminants are possibly deposited when feeding the high-pressure fluid alone into the chamber 30. Therefore, after finishing the cleaning substep, the following substeps are preferably performed: A rinsing substep is performed with the high-pressure fluid containing the compatibilizer, and then a displacement substep is performed with the high-pressure fluid alone.

The rinsing substep is performed as follows: The first-chemical supplying controller 22 is in stop mode. The second-chemical supplying controller 25 is in supply mode. The high-pressure fluid is continuously fed into the chamber 30 with the high-pressure fluid feeder 1. Simultaneously, the compatibilizer is continuously fed into the chamber 30 with the second-chemical supplying controller 25. The pressure in the chamber 30 is controlled with the control valve 32 during these operations. The chamber 30 preferably has the same pressure as that in the high-pressure processing step (the cleaning substep). Hence, the rates of feeding and draining are preferably the same, but may be different from each other. A semibatch operation may be employed. The semibatch operation is described as follows: The high-pressure fluid and the compatibilizer are fed into the chamber 30, and then the feeding is stopped. Next, the amount fed is drained from the chamber 30. This cycle is repeated. The high-pressure fluid drained from the chamber 30 is delivered to a gasification unit 4. In the rinsing substep, the temperature in the chamber 30 is not limited, provided that the chamber has the same temperature as that in the high-pressure processing step.

In the rinsing substep, the contents of the contaminants and the cleaning component are gradually decreased by feeding and draining the mixture fluid containing the high-pressure fluid and the compatibilizer. Hence, the feeding rate of the compatibilizer may be gradually decreased by adjusting the second-chemical supplying controller 25. The cleaning component and the contaminants are completely drained from the chamber 30. As a result, the chamber 30 is filled with the high-pressure fluid and the compatibilizer. Subsequently, a displacement substep is preferably performed with the high-pressure fluid alone. The time required for the rinsing substep is usually 30 seconds.

It is preferable to use only the high-pressure fluid in the displacement substep. The second-chemical supplying controller 25 is in stop mode. Only the high-pressure fluid is fed into the chamber 30 to displace the content of the chamber 30 from the mixture containing the high-pressure fluid and the compatibilizer to the high-pressure fluid alone. When the chamber 30 is completely displaced with only the high-pressure fluid, the displacement substep is finished. The time required for the displacement substep is usually 30 to 120 seconds. In the displacement substep, the temperature in the chamber is not limited, provided that the chamber has the same temperature as that in the high-pressure processing step.

In each of the high-pressure processing step, the rinsing substep, and the displacement substep, the mixture containing the high-pressure fluid, the chemical agents, and/or the undesired materials drained from the chamber 30 is delivered through the control valve 32 to the gasification unit 4.

The gasification unit 4 includes a vapor-liquid separator 41, a high-pressure valve 42 for a liquid (or a solid) component, and high-pressure valves 43 and 44 for gas components. A purification unit (not shown), for example, a rectifying column, or an adsorption column may be provided, if necessary. Although the fluid is not circulated in FIG. 3, the fluid may be circulated by connecting between the gasification unit 4 and the high-pressure fluid feeder 1 (in particular, reservoir 10) with, for example, a connecting pipe and by providing a liquefier such as a condenser between the gasification unit 4 and the reservoir 10.

In the vapor-liquid separator 41, a mixture of the contaminants and the chemical agents (cleaning component and compatibilizer) is separated by vaporizing the fluid, to give a liquid component. When the contaminants are deposited as a solid, the chemical agent containing the deposited contaminants can be separated. A variety of vapor-liquid separators for simple distillation, distillation (rectification), and flash distillation and a centrifuge may be used as the vapor-liquid separator 41. The gas component separated with the vapor-liquid separator 41 is transferred to the liquefier (not shown) such as a condenser through the high-pressure valve 43 and an optionally provided refiner (not shown), and then the gas component is subjected to a desired treatment. In the vapor-liquid separator 41, the pressure may be decreased to atmospheric pressure or 4 to 7 MPa.

The depressurized fluid, for example, depressurized carbon dioxide fluid can be a mixture containing a gaseous fluid (carbon dioxide gas) and a liquid fluid (liquefied carbon dioxide) depending on the relationship between the temperature and the pressure. To enhance the efficiency of the separation in the vapor-liquid separator 41, it is preferable to completely vaporize the depressurized fluid at a heater 45 provided before the vapor-liquid separator 41. The gas can also be transferred and reused in other step. In addition, the gas in the vapor-liquid separator 41 may be released into the air.

A liquid (or solid) mixture containing the contaminants, the cleaning component, and the compatibilizer is drained from the bottom of the vapor-liquid separator 41 through the high-pressure valve 42 for a liquid (or solid) component and then the mixture is subjected to a subsequent treatment, if necessary.

A depressurizing step and the embodiments of the depressurizing step of the present invention will be described below. Each of the high-pressure processing step, the cleaning substep, and the displacement substep is performed at a pressure of 5 to 30 MPa, preferably 7.4 to 20 MPa. At the end of the displacement substep, the chamber 30 contains the high-pressure fluid and the object. To remove the object subjected to the high-pressure processing from the chamber 30 and to place another object into the chamber 30 and then to start a new high-pressure processing, the remaining high-pressure fluid needs to be removed and to depressurize the chamber 30 to atmospheric pressure.

To prevent the temperature descent in the chamber 30 while depressurizing, the above-described stepwise depressurization is preferably performed. The stepwise depressurization can readily recover the temperature decreased by depressurization. For example, in the primary depressurizing substep, the pressure in the chamber 30 is decreased to a pressure in which the temperature is not decreased to the vapor-liquid phase coexistence region in an adiabatic expansion. In the case of carbon dioxide, the pressure at the end of the primary depressurizing substep is preferably 10 MPa or less, more preferably 5 to 8 MPa at a processing temperature of 60° C. To suppress or recover the temperature descent during or after the primary depressurizing substep, the feeding rate of the heated and pressurized fluid depending on the set flow rate of the booster 12 (force pump), which is provided at the high-pressure fluid feeder 1, and the draining rate of the fluid from the chamber 30 are adjusted with the control valves 32 and 35 while the temperature of the heated and pressurized fluid is adjusted with the heater 13. For example, after the displacement substep, the control valve 32 is opened, and then the pressure in the chamber 30 is decreased to a predetermined finishing pressure of the primary depressurizing substep by draining the fluid from the chamber 30. When the pressure reaches the predetermined pressure, the control valve 32 is closed. Alternatively, when the pressure reaches the predetermined pressure, the feeding rate and the draining rate of the heated and pressurized fluid is adjusted by controlling the valve openings of the control valves 32 and 35. As a result, the temperature and the rate of depressurization are preferably controlled. In addition, the fluid in the chamber 30 may be drained while the heated and pressurized fluid is fed into the chamber 30 by adjusting the valve openings of the control valves 32 and 35. The pressure in the chamber 30 can be controlled by adjusting the valve opening of the control valve 32 depending on the pressure (gage pressure) in the chamber 30 measured with the pressure gage 31. The flow rate is determined depending on the processing temperature and pressure. The temperature of the object cannot be directly measured. The flow rate is therefore determined such that the temperature is not reduced to the vapor-liquid phase coexistence region and such that the temperature in the chamber 30, which is measured with the temperature-measuring instrument 34, reaches a predetermined temperature within a predetermined period. The heated and pressurized fluid is not limited, provided the heated and pressurized fluid is heated before feeding.

In a successive secondary depressurizing substep, the chamber 30 is depressurized to atmospheric pressure. The control valve 35 is closed and the fluid in the chamber 30 is transferred to the gasification unit 4 until the pressure in the chamber 30 reaches atmospheric pressure by adjusting the control valve 32. When the chamber 30 has already considerably depressurized and the temperature in the chamber 30 is maintained at a temperature near that at the start of the depressurizing step, the appearance of the liquid phase can be blocked even if the temperature is decreased due to the secondary depressurizing substep.

In the primary and secondary depressurizing substeps, the draining rate from the chamber is controlled with the control valve 32. In this embodiment, the same chamber is used for both primary and secondary depressurizing substeps. However, a depressurizing unit (not shown) having a pressure valve and a pressure vessel may be disposed in parallel with the control valve 32, and the depressurization may be performed in the pressure vessel. Furthermore, a plurality of depressurization units may be disposed, and the depressurization may be performed.

After the secondary depressurizing substep, the pressure in the chamber 30 is equal to atmospheric pressure. The lid of the chamber 30 is opened and the object is taken out with the transfer unit. Since carbon dioxide around the object is vaporized by depressurization to atmospheric pressure, the object, for example, a semiconductor substrate can be obtained in a dry state without smudges and destruction of the microstructure. In the present invention, the temperature in the chamber 30 is not limited when the object is removed from the chamber 30. The object may be removed from the chamber 30 at a temperature higher than room temperature.

After removing the object from the chamber 30, high-pressure processing of another object is performed. The object is placed into the chamber 30, and the chamber 30 is enclosed by closing the lid. And then, the chamber 30 is filled with a high-pressure fluid.

A high-pressure processing apparatus is useful for cleaning and development of a semiconductor in a semiconductor manufacturing process. At least the high-pressure processing chamber is preferably installed in a clean room. Any other units of the high-pressure processing apparatus other than the high-pressure processing chamber are desirably installed depending on the space of the clean room.

Figure 4:
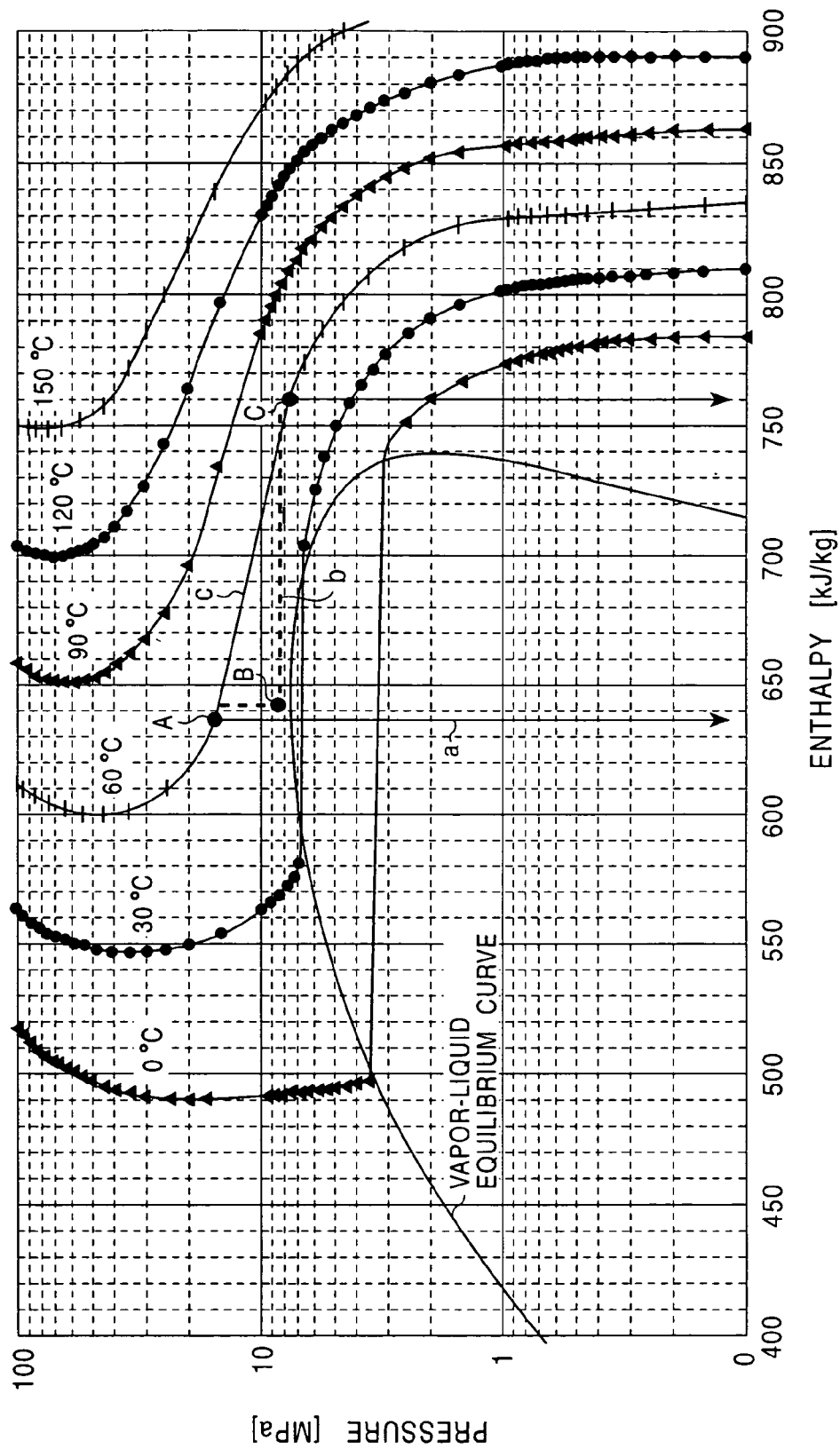
FIG. 4 is a Mollier diagram illustrating a method according to the present invention.

FIG. 4 is a Mollier diagram (pressure-enthalpy chart) depicting the present invention. The temperature of carbon dioxide is a parameter of the diagram. In the diagram, the lower pressures of the vapor-liquid equilibrium curve are the vapor-liquid phase coexistence regions. In the present invention, it is necessary to operate so that the temperature does not enter the vapor-liquid phase coexistence region.

For example, in the case of the operation at a temperature of 60° C. and a pressure of 15 MPa, point A represents the 60° C. and 15 MPa. When the pressure is quickly decreased from point A, the temperature is dropped on line a. As a result, the liquid phase appears because the temperature enters the inside region of the vapor-liquid equilibrium curve. Two-step depressurization is preferably employed as shown in FIG. 1 so that the temperature does not enter the inside of the vapor-liquid equilibrium curve. For example, when the pressure is decreased to 8 MPa (primary depressurizing substep), the temperature is decreased to point B on line b due to an adiabatic expansion, point B representing a temperature higher than the critical temperature of carbon dioxide. However, since point B is outside of the vapor-liquid equilibrium curve, the liquid phase does not appear. Next, the temperature is recovered to 60° C. by feeding a heated and pressurized fluid (point C). Since the temperature does not enter the inside of the vapor-liquid equilibrium curve even when the pressure is quickly decreased from point C (secondary depressurizing substep), the appearance of the liquid phase is prevented. In such two-step depressurization, the pressure is determined so that the temperature does not enter the inside of the vapor-liquid equilibrium curve during the primary depressurizing substep and the temperature is recovered by feeding a heated and pressurized fluid so as not to enter the inside of the vapor-liquid equilibrium curve during the secondary depressurizing substep. Consequently, the appearance of the liquid phase can be prevented.

A high-pressure processing apparatus preferably of the present invention preferably has a memory unit with data corresponding to the Mollier diagram including the vapor-liquid equilibrium curve. The memory unit preferably has the following functions: Loading the data corresponding to the temperature and the pressure of the chamber 30; selecting the Mollier diagram corresponding to the data; and deciding whether the selected Mollier diagram crosses the vapor-liquid equilibrium curve or not. Furthermore, the memory unit preferably controls as follows: When the memory unit decides that the selected Mollier diagram crosses the vapor-liquid equilibrium curve during depressurization, the memory unit sends some signals. According to the signals, as described above, the high-pressure processing apparatus suppresses the temperature descent in the chamber 30 or recovers the temperature in the chamber 30.

As shown in FIG. 2, when the pressure is decreased to 8 MPa while feeding a heated and pressurized fluid, the pressure reaches point C on line c shown in FIG. 4 while substantially maintaining a constant temperature (primary depressurizing substep). And then, when the pressure is decreased from point C (secondary depressurizing substep), since the temperature does not enter the inside of the vapor-liquid equilibrium curve, the appearance of the liquid phase can be prevented. When the secondary depressurizing substep is performed from a point representing 9 MPa on line c (not shown), the temperature enters the inside of the vapor-liquid equilibrium curve, thus resulting in the appearance of the liquid phase. Consequently, the pressure and the feeding rate of the heated and pressurized fluid are adjusted such that the temperature does not enter the inside of the vapor-liquid equilibrium curve during depressurization; therefore, the appearance of the liquid phase due to depressurization can be prevented.

What is claimed is:

1. A method for high-pressure processing, comprising:
   a high-pressure processing step of processing an object under a high pressure by bringing at least a high-pressure fluid into contact with the object in a high-pressure processing chamber under the high pressure;
   a displacement step, performed subsequent to the high-pressure processing step, of replacing the high-pressure fluid in the high-pressure processing chamber with a supercritical fluid; and
   a depressurizing step of decreasing the pressure of the supercritical fluid in the high-pressure processing chamber to atmospheric pressure, wherein the depressurizing step includes a substep in which the pressure in the high-pressure processing chamber is maintained substantially constant to suppress or recover a temperature descent caused by an adiabatic expansion during the depressurizing step, and wherein the temperature in the chamber during the depressurizing step is controlled to be maintained above a temperature achieved by an adiabatic expansion, the adiabatic expansion starting from the pressure and temperature at the end of the high-pressure processing step, wherein the temperature in the chamber during the displacement step and the depressurizing step does not exceed the temperature at the end of the high-pressure processing step.

2. The method for high-pressure processing according to claim 1, wherein the profiles of pressure and the temperature in the chamber are controlled so that the temperature does not reach the vapor-liquid phase coexistence region during the depressurizing step.

3. The method for high-pressure processing according to claim 1,
   wherein said substep comprises feeding a heated and pressurized fluid into the high-pressure processing chamber during the depressurizing step.

4. The method for high-pressure processing according to claim 3, wherein the heated and pressurized fluid is fed into the high-pressure processing chamber after the pressure is reduced to a pressure which does not lead to a vapor-liquid phase coexistence region during the depressurizing step.

5. A method for high-pressure processing, comprising:
   a high-pressure processing step of processing an object under a high pressure by bringing at least a high-pressure fluid into contact with the object in a high-pressure processing chamber under the high pressure and constant temperature throughout the high-pressure processing step;
   a displacement step, performed subsequent to the high-pressure processing step, of replacing the high-pressure fluid in the high-pressure processing chamber with a supercritical fluid; and
   a depressurizing step of decreasing the pressure of the supercritical fluid in the high-pressure processing chamber to atmospheric pressure, wherein the depressurizing step includes a substep in which the pressure in the high-pressure processing chamber is maintained substantially constant to suppress or recover a temperature descent caused by an adiabatic expansion during the depressurizing step, and wherein the temperature in the chamber during the depressurizing step is controlled to be maintained above a temperature achieved by an adiabatic expansion, the adiabatic expansion starting from the pressure and temperature at the end of the high-pressure processing step, wherein the temperature in the chamber during the displacement step and the depressurizing step does not exceed the temperature in the high-pressure processing step.

6. A method for high-pressure processing, comprising:
   a high-pressure processing step of processing an object under a high pressure by bringing at least a high-pressure fluid into contact with the object in a high-pressure processing chamber under the high pressure;
   a displacement step, performed subsequent to the high-pressure processing step, of replacing the high-pressure fluid in the high-pressure processing chamber with a supercritical fluid;
   a depressurizing step of decreasing the pressure of the supercritical fluid in the high-pressure processing chamber to atmospheric pressure while the temperature in the chamber is controlled to be maintained above a temperature achieved by an adiabatic expansion, the adiabatic expansion starting from the pressure and temperature at the end of the high-pressure processing step, wherein the temperature in the chamber during the displacement step and the depressurizing step does not exceed the temperature at the end of the high-pressure processing step, and
   a feeding substep of feeding a heated and pressurized fluid into the high-pressure processing chamber during the depressurizing step,
   wherein the temperature in the high-pressure processing chamber is controlled in the feeding substep so as to suppress or recover a temperature descent caused by an adiabatic expansion during the depressurizing step.

7. The method for high-pressure processing according to claim 6, wherein the profiles of pressure and the temperature in the chamber are controlled so that the temperature does not reach the vapor-liquid phase coexistence region during the depressurizing step.

8. The method for high-pressure processing according to claim 6, wherein the heated and pressurized fluid is fed into the high-pressure processing chamber after the pressure is reduced to a pressure which does not lead to a vapor-liquid phase coexistence region during the depressurizing step.

9. A method for high-pressure processing, comprising:
   a high-pressure processing step of processing an object under a high pressure by bringing at least a high-pressure fluid into contact with the object in a high-pressure processing chamber under the high pressure and constant temperature throughout the high-pressure processing step;
   a displacement step, performed subsequent to the high-pressure processing step, of replacing the high-pressure fluid in the high-pressure processing chamber with a supercritical fluid; and a depressurizing step of decreasing the pressure of the supercritical fluid in the high-pressure processing chamber to atmospheric pressure while the temperature in the chamber is controlled to be maintained above a temperature achieved by an adiabatic expansion, the adiabatic expansion starting from the pressure and temperature at the end of the high-pressure processing step, wherein the temperature in the chamber during the displacement step and the depressurizing step does not exceed the temperature in the high-pressure processing step, and a feeding substep of feeding a heated and pressurized fluid into the high-pressure processing chamber during the depressurizing step, wherein the temperature in the high-pressure processing chamber is controlled in the feeding substep so as to suppress or recover a temperature descent caused by an adiabatic expansion during the depressurizing step.

* * * * *